(12) United States Patent
Cadouri

(10) Patent No.: US 7,169,638 B1
(45) Date of Patent: Jan. 30, 2007

(54) ADJUSTING DIE PLACEMENT ON A SEMICONDUCTOR WAFER TO INCREASE YIELD

(75) Inventor: Eitan Cadouri, Cupertino, CA (US)

(73) Assignee: PDF Solutions, Inc., San Jose, CA (US)

( * ) Notice: Subject to any disclaimer, the term of this patent is extended or adjusted under 35 U.S.C. 154(b) by 43 days.

(21) Appl. No.: 10/802,549

(22) Filed: Mar. 16, 2004

Related U.S. Application Data

(60) Provisional application No. 60/454,706, filed on Mar. 17, 2003.

(51) Int. Cl.
*H01L 21/44* (2006.01)
*H01L 21/48* (2006.01)
*H01L 21/50* (2006.01)

(52) U.S. Cl. ...................... 438/106; 438/460

(58) Field of Classification Search ............... 438/106, 438/460, 462, 464
See application file for complete search history.

(56) References Cited

U.S. PATENT DOCUMENTS

| 5,933,351 A * | 8/1999 | Balamurugan ............... 700/121 |
| 6,756,796 B2 * | 6/2004 | Subramanian .............. 324/750 |
| 2003/0094965 A1 * | 5/2003 | Tseng ......................... 324/765 |

* cited by examiner

*Primary Examiner*—Phuc T. Dang
(74) *Attorney, Agent, or Firm*—Morrison & Foerster LLP

(57) ABSTRACT

A die placement of dice to be formed on a semiconductor wafer is adjusted by obtaining a die placement and one or more locations on the wafer contacted by one or more processing structures or a substance emitted by one or more processing structures. The die placement is adjusted based on the obtained one or more locations on the wafer.

22 Claims, 6 Drawing Sheets

ADJUSTING DIE PLACEMENT ON A SEMICONDUCTOR WAFER TO INCREASE YIELD

CROSS-REFERENCE TO RELATED APPLICATIONS

This application claims the benefit of U.S. Provisional Application No. 60/454,706, titled A PROCESS FOR IMPROVING CYCLE TIME TO ACHIEVE MAXIMUM YIELD OF SEMICONDUCTOR CHIPS, filed Mar. 17, 2003, the entire content of which is incorporated herein by reference.

BACKGROUND

1. Field of the Invention

The present application relates to die placement on a semiconductor wafer, and more particularly to adjusting a die placement to increase yield of the dice formed on the wafer.

2. Related Art

Semiconductor devices are typically manufactured by fabricating the devices on a semiconductor wafer. An individual device is formed as a die on the wafer using known semiconductor fabrication processes. Depending on the size of the die, a single wafer can contain hundreds of dice. The dice are generally arranged in a pattern (i.e., a die placement) on the wafer to maximize the number of dice on the wafer.

During a fabrication process, a processing structure can contact the wafer or emit a substance that contacts the wafer. Dice that are formed in, adjacent, or opposite locations on the wafer that come in contact with the processing structure or the substance emitted by the processing structure are typically bad, meaning that the devices on the dice have unacceptable failure rates or do not function at all. Thus, the overall yield, meaning the total number of good dice formed on the wafer, is reduced.

In one approach to increase yield, the processing structure is moved to adjust the location on the wafer that is contacted by the processing structure or the substance emitted by the processing structure. There are, however, only a limited number of locations where the processing structure can be moved. Additionally, the increase in yield is typically small, particularly relative to the time and cost associated with moving the processing structure.

SUMMARY

In one exemplary embodiment, a die placement of dice to be formed on a wafer is adjusted by obtaining a die placement and one or more locations on the wafer contacted by one or more processing structures or a substance emitted by one or more processing structures. The die placement is adjusted based on the obtained one or more locations on the wafer.

DESCRIPTION OF DRAWING FIGURES

The present application can be best understood by reference to the following description taken in conjunction with the accompanying drawing figures, in which like parts may be referred to by like numerals:

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

Figure 1:
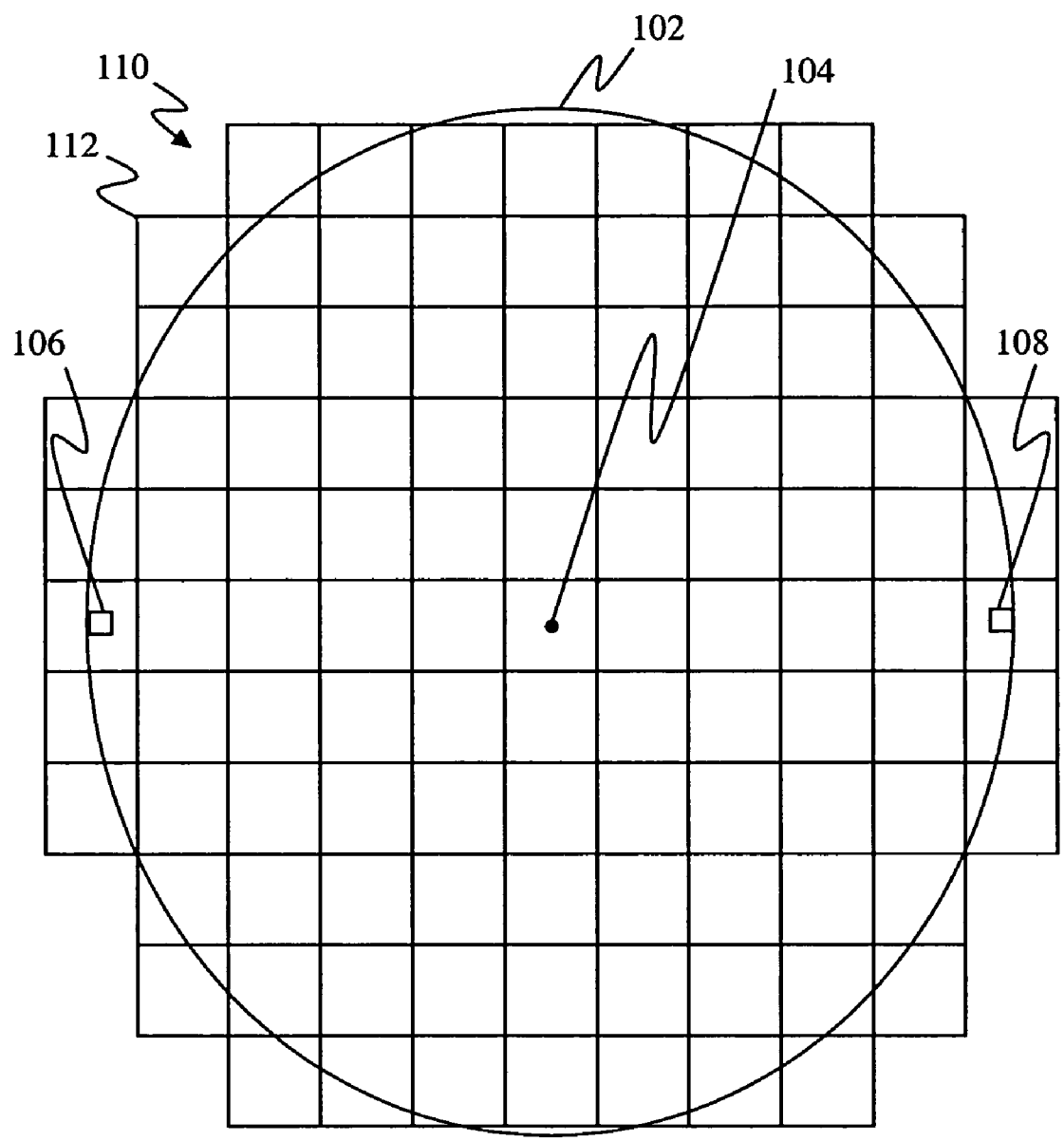
FIG. 1 depicts an exemplary die placement of dice to be formed on a semiconductor wafer with locations on the wafer contacted by processing structures or a substance emitted by processing structures.

With reference to FIG. 1, an exemplary semiconductor wafer 102 is depicted having a center 104 and locations 106, 108 on wafer 102 contacted by processing structures or a substance emitted by processing structures. For example, the processing structures can include a clamp that contacts the wafer, a jet that emits a chemical solution or water that contacts the wafer, and the like. It should be recognized that the size, number, and positions of locations 106, 108 can vary depending on the processing structures and the fabrication process used. For example, there can be one location on wafer 102 contacted by a single processing structure.

FIG. 1 also depicts a die placement 110 of a plurality of reticle arrays 112. In one exemplary embodiment, each reticle array 112 includes a plurality of dice arranged in an array, such as 25 dice arranged in a 5×5 array. It should be recognized, however, that a reticle array 112 can include any number of dice arranged in various patterns. Additionally, it should be recognized that die placement 110 can include any number of reticle arrays 112 arranged in various patterns.

In FIG. 1, locations 106, 108 are depicted as being on the same surface on wafer 102 as the surface on which dice are to be formed. It should be recognized, however, that locations 106, 108 can be on the opposite surface of wafer 102 as the surface on which dice are to be formed. For example, dice can be formed on a front side of wafer 102, and a clamp can contact a location on the back side of the wafer opposite the front side.

In one simulation, a die placement 110 as depicted in FIG. 1 was used. In the simulation, a reticle array 112 of 25 dice arranged in a 5×5 array was used. Additionally, clamps were assumed to be located to contact wafer 102 in locations 106, 108 as depicted in FIG. 1. The total yield resulting from this simulation was 1953 yielding (good) dice.

Figure 2:
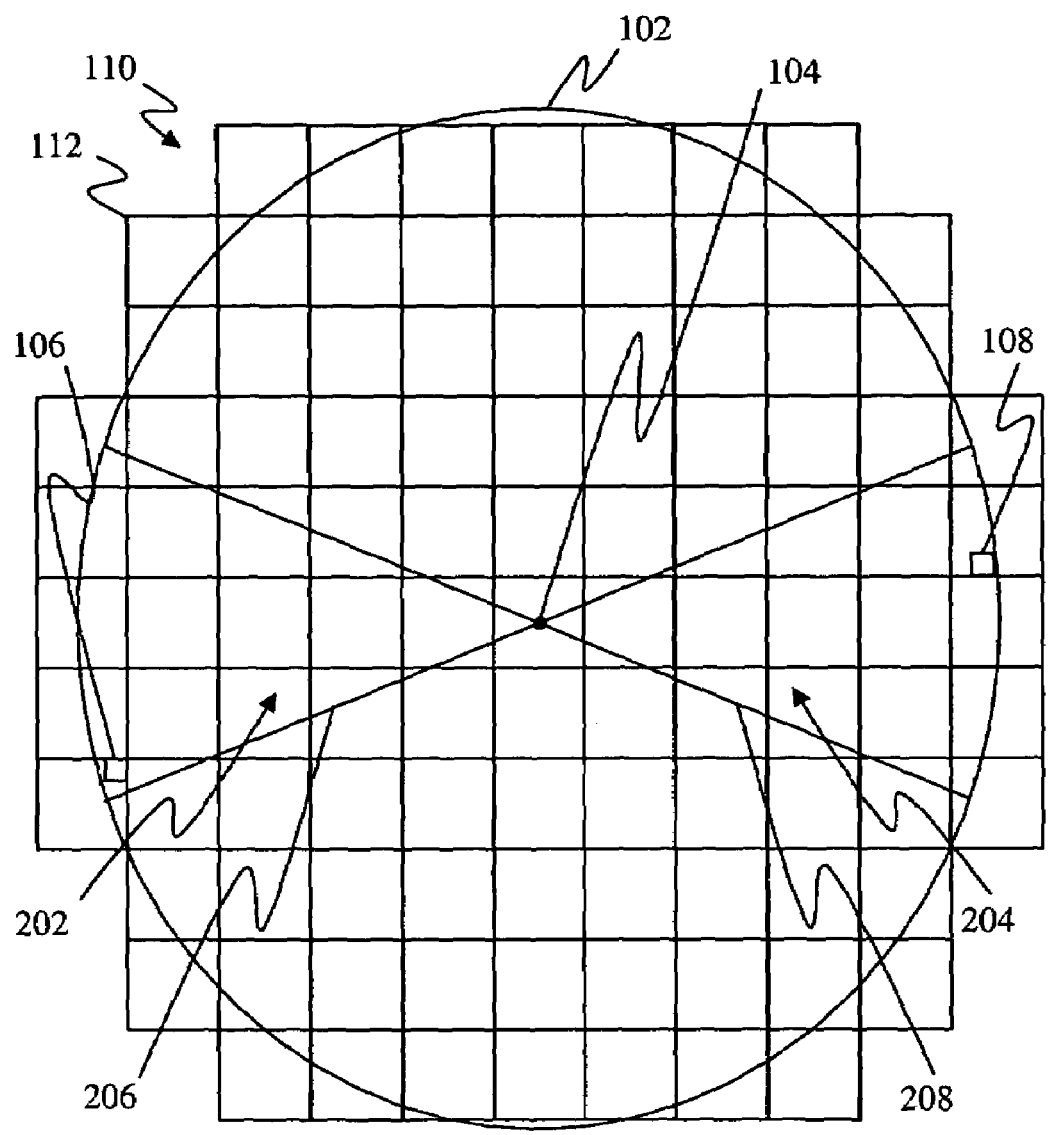
FIG. 2 depicts the exemplary die placement depicted in FIG. 1 with different locations on the wafer contacted by processing structures or a substance emitted by processing structures.

With reference to FIG. 2, locations 106, 108 can be adjusted to increase yield. More particularly, FIG. 2 depicts exemplary relocation areas 202 and 204 defined by boundary lines 206 and 208. It should be recognized, however, that the sizes, shapes and locations of relocation areas 202, 204 can vary depending on the on the processing structures and the fabrication process used.

In one simulation, the clamps were assumed to have been moved to contact locations 106, 108 as depicted in FIG. 2. Die placement 110 and reticle arrays 112 were kept the same as in the simulation described above in connection with FIG. 1. The total yield resulting from this simulation was 1956 yielding (good) dice. Thus, the increase in yield from the simulation described above in connection with FIG. 1 was three yielding (good) dice.

Figure 3:
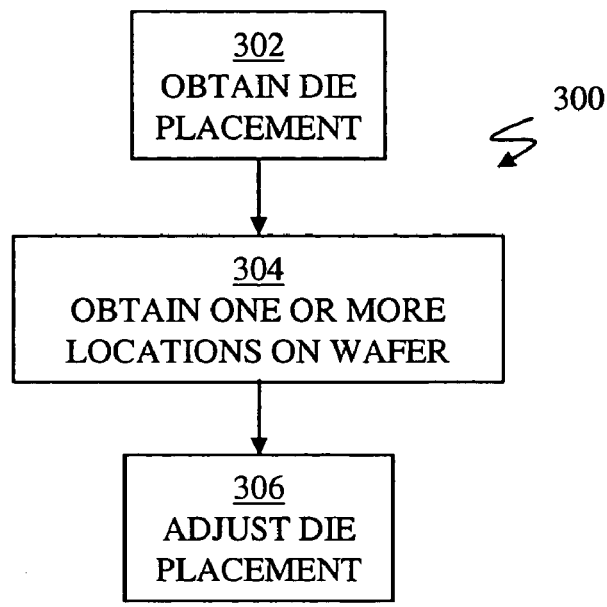
FIG. 3 depicts an exemplary process of adjusting a die placement.

With reference to FIG. 3, an exemplary process 300 is depicted of adjusting a die placement of dice to be formed on a wafer. In step 302, a die placement of dice to be formed on the wafer is obtained. For example, with reference to FIG. 1, assume that die placement 110 in FIG. 1 represents an initial die placement that is obtained. As noted above, die placement 110 can include any number of reticle arrays 112 arranged in various patterns, and each reticle array 112 can include any number of dice arranged in various patterns.

With reference again to FIG. 3, in step 304, one or more locations on the wafer contacted by one or more processing structures or a substance emitted by one or more processing structures are obtained. For example, with reference to FIG. 1, assume that locations 106, 108 in FIG. 1 represent initial locations on wafer 102 contacted by the processing structures or the substance emitted by the processing structures.

With reference to FIG. 3, in step 306, the die placement is adjusted based on the obtained one or more locations on the wafer. In one exemplary embodiment, the die placement is adjusted to increase yield of the dice formed on the wafer. In particular, the die placement is adjusted to reduce the number of bad dice associated with the one or more locations on the wafer.

Figure 5:
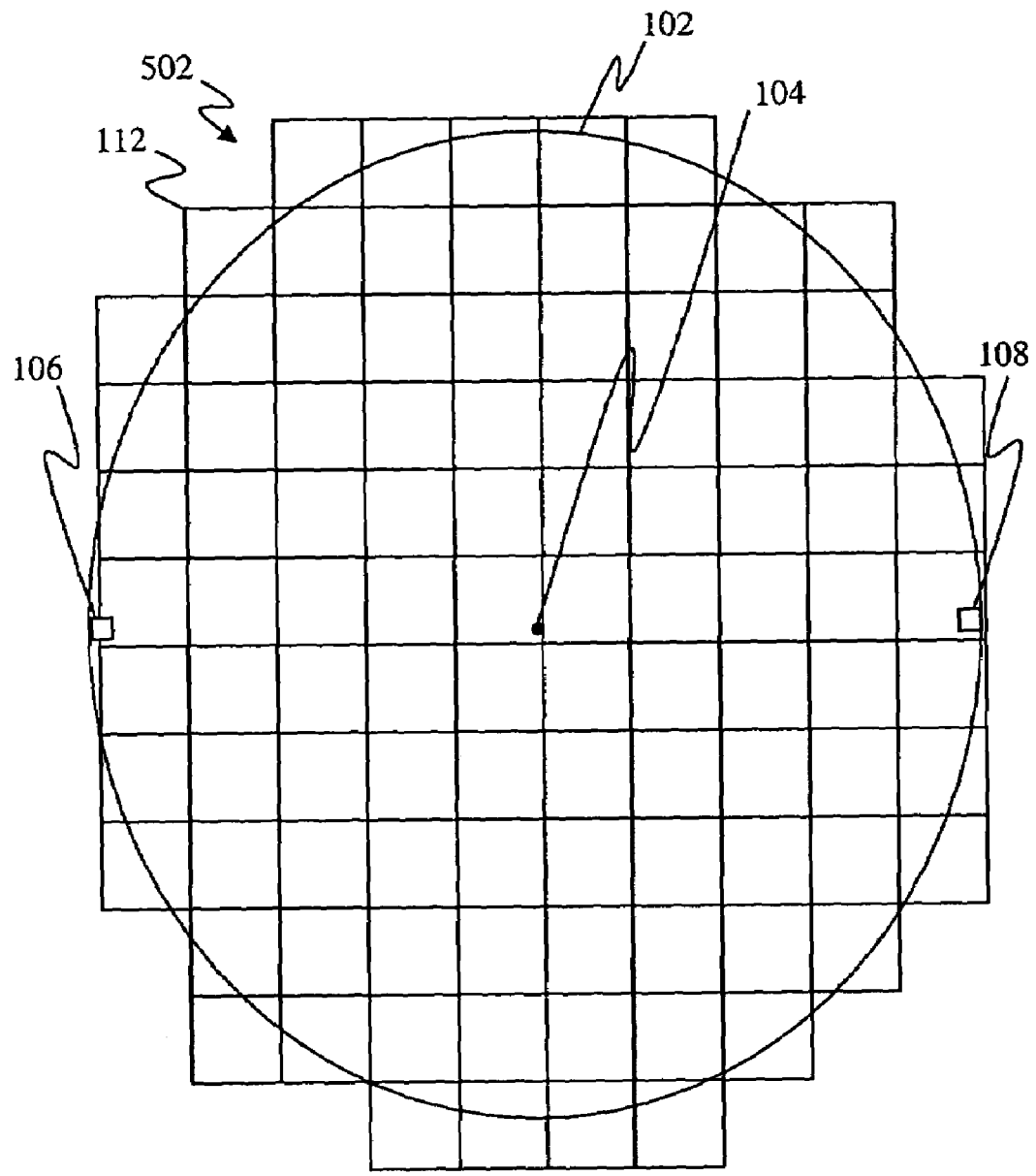
FIG. 5 depicts an exemplary die placement of dice to be formed on a semiconductor wafer with locations on the wafer contacted by processing structures or a substance emitted by processing structures.

For example, in one simulation, die placement 110 in FIG. 1 was adjusted to die placement 502 in FIG. 5, while locations 106, 108 remained the same. The total yield resulting from this simulation was 1963 yielding (good) dice. Thus, the increase in yield from the simulation described above in connection with FIG. 2 was seven more yielding (good) dice, and the increase in yield from the simulation described above in connection with FIG. 1 was 10 more yielding (good) dice.

Figure 4:
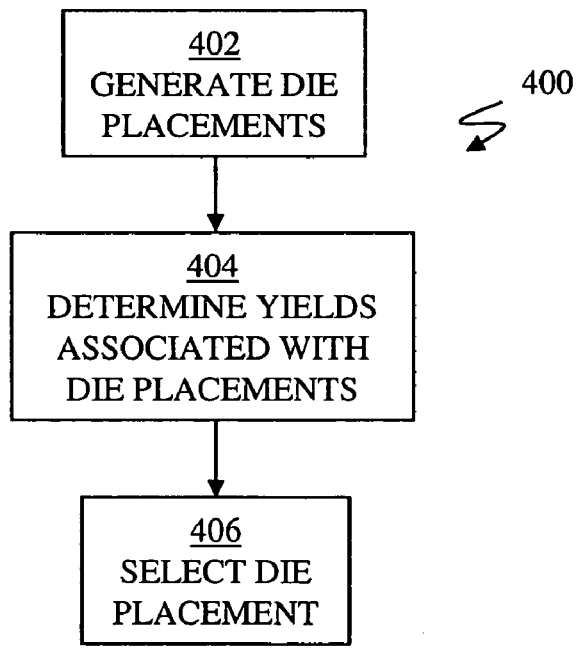
FIG. 4 depicts an exemplary process of selecting a die placement during the exemplary process depicted in FIG. 3.

With reference to FIG. 4, an exemplary process 400 is depicted of selecting a die placement. In step 402, a plurality of die placements having different arrangements of reticle arrays, and thus different arrangements of dice, are generated. In step 404, a yield associated with each of the plurality of die placements is determined. In step 406, the die placement with the highest yield is selected.

Process 400 can be performed as a batch process. More particularly, the plurality of die placements are generated together, then the yields for the plurality of die placements are generated together.

Alternatively, process 400 can be performed iteratively. More particularly, a first die placement can be generated, then the yield for the first die placement is determined. After the yield is determined, a second die placement is generated, then the yield for the second die placement is determined.

Figure 6:
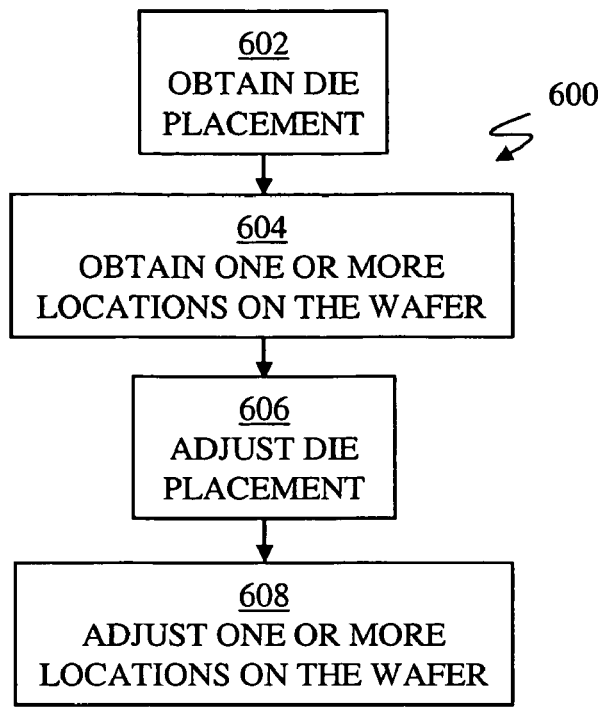
FIG. 6 depicts another exemplary process of adjusting a die placement.

With reference to FIG. 6, an exemplary process 600 is depicted of adjusting a die placement of dice to be formed on a wafer. In step 602, a die placement of dice to be formed on the wafer is obtained. In step 604, one or more locations on the wafer contacted by one or more processing structures or a substance emitted by one or more processing structures are obtained. In step 606, the die placement is adjusted based on the obtained one or more locations on the wafer. In step 608, the one or more locations on the wafer are adjusted based on the die placement.

In process 600, the die placement and the one or more locations on the wafer are adjusted together. In one exemplary embodiment, the die placement and the one or more locations on the wafer are adjusted to increase yield of the dice formed on the wafer. In particular, the die placement and the one or more locations on the wafer are adjusted to reduce the number of bad dice associated with the one or more locations on the wafer.

Figure 8:
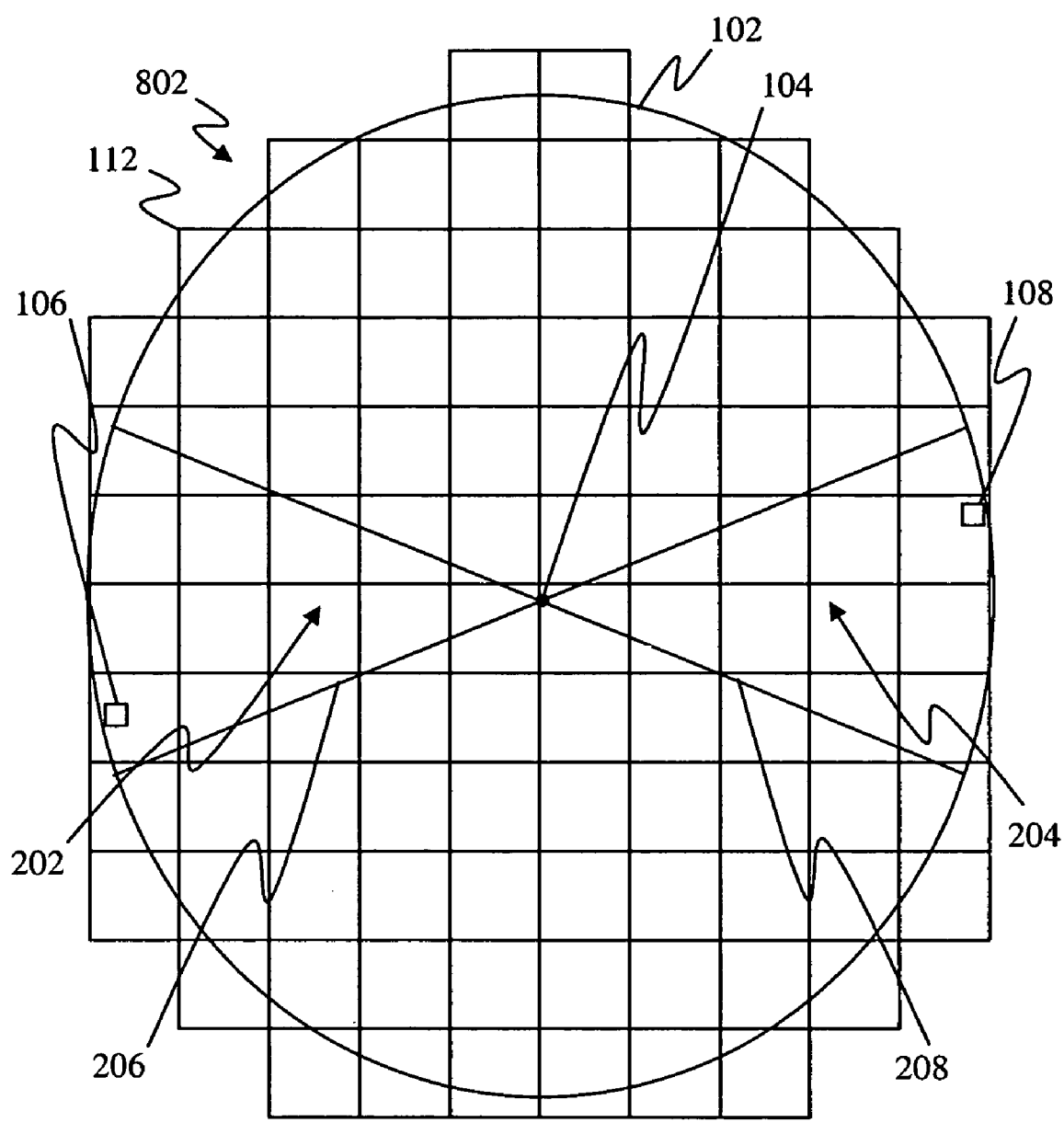
FIG. 8 depicts an exemplary die placement and locations on the wafer contacted by processing structures or a substance emitted by processing structures.

For example, in one simulation, die placement 110 in FIG. 1 was adjusted to die placement 802 in FIG. 8, and locations 106, 108 were adjusted to new locations as depicted in FIG. 8. The total yield resulting from this simulation was 1967 yielding (good) dice. Thus, the increase in yield from the simulation described above in connection with FIG. 5 was four more yielding (good) dice, the increase in yield from the simulation described above in connection with FIG. 2 was 11 more yielding (good) dice, and the increase in yield from the simulation described above in connection with FIG. 1 was 14 more yielding (good) dice.

Figure 7:
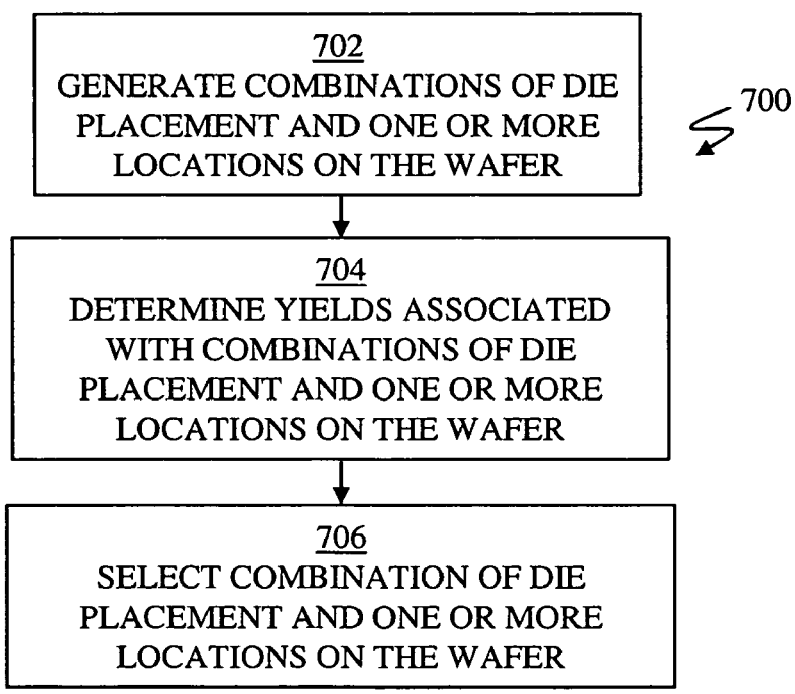
FIG. 7 depicts another exemplary process of selecting a die placement during the exemplary process depicted in FIG. 6.

With reference to FIG. 7, an exemplary process 700 is depicted of selecting a die placement and one or more locations on the wafer. In step 702, a plurality of combinations of die placement and one or more locations on the wafer are generated. In step 704, a yield associated with each combination of die placement and one or more locations on the wafer is determined. In step 706, the combination of die placement and one or more locations on the wafer with the highest yield is selected.

Process 700 can be performed as a batch process. More particularly, the plurality of combinations of die placement and locations of one or more processing structures are generated together, then the yields for the combinations of die placement and locations of one or more processing structures are generated together.

Alternatively, process 700 can be performed iteratively. More particularly, a first combination of die placement and one or more locations on the wafer can be generated, then the yield for the first combination of die placement and one or more locations on the wafer is determined. After the yield is determined, a second combination of die placement and one or more locations on the wafer is generated, then the yield for the second combination of die placement and one or more locations on the wafer is determined.

Although exemplary embodiments have been described, various modifications can be made without departing from the spirit and/or scope of the present invention. Therefore, the present invention should not be construed as being limited to the specific forms shown in the drawings and described above.

I claim:

1. A method of adjusting a die placement of dice to be formed on a wafer, the method comprising:
   a) obtaining a die placement of dice to be formed on the wafer;
   b) obtaining one or more locations on the wafer contacted by one or more processing structures or a substance emitted by one or more processing structures; and
   c) adjusting the die placement based on the obtained one or more locations on the wafer.

2. The method of claim 1, wherein the die placement is adjusted to increase yield of the dice formed on the wafer.

3. The method of claim 2, wherein step c) of claim 1 comprises:

generating a plurality of die placements having different arrangements of dice;

determining a yield associated with each of the plurality of die placements; and selecting a die placement with the highest yield from the plurality of die placements.

4. The method of claim 3, wherein yield is determined based on the number of good dice formed on the wafer.

5. The method of claim 1, further comprising:
d) adjusting the one or more locations on the wafer based on the die placement, wherein the die placement and the one or more locations on the wafer are adjusted together.

6. The method of claim 5, wherein the die placement and one or more locations on the wafer are adjusted to increase yield of the dice formed on the wafer.

7. The method of claim 6, wherein step c) of claim 1 and step d) of claim 5 comprise:
generating a plurality of combinations of die placement and one or more locations on the wafer;
determining a yield associated with each of the plurality of combinations of die placement and one or more locations on the wafer, and
selecting a combination of die placement and one or more locations on the wafer with the highest yield from the plurality of combinations of die placement and one or more locations on the wafer.

8. The method of claim 1, wherein the die placement includes an arrangement of reticle arrays, and wherein each reticle array includes an arrangement of dice.

9. The method of claim 1, wherein the one or more processing structures include a clamp to hold the wafer during a fabrication process.

10. The method of claim 1, wherein the one or more processing structures include a jet that emits a chemical solution or water at the wafer.

11. The method of claim 1, wherein the dice are formed on a first surface on the wafer, and wherein the one or more locations are on the first surface of the wafer or on a second surface on the wafer opposite the first surface.

12. A method of adjusting a die placement of dice to be formed on a wafer, the method comprising:
a) obtaining a die placement of dice to be formed on the wafer, the die placement having an arrangement of reticle arrays, wherein each reticle array includes an arrangement of dice to be formed on the wafer;
b) obtaining one or more locations on the wafer contacted by one or more clamps; and
c) adjusting the die placement based on the obtained one or more locations on the wafer.

13. The method of claim 12, wherein step c) of claim 12 comprises:
generating different die placements having different arrangements of reticle arrays;
determining yields associated with the different die placements; and
selecting a die placement with the highest yield from the different die placements.

14. The method of claim 12, further comprising:
d) adjusting the one or more locations on the wafer based on the die placement, wherein the die placement and the one or more locations on the wafer are adjusted together.

15. The method of claim 14, wherein step c) of claim 12 and step d) of claim 14 comprise:
generating a plurality of combinations of die placement and one or more locations on the wafer;
determining a yield associated with each of the plurality of combinations of die placement and one or more locations on the wafer; and
selecting a combination of die placement and one or more locations on the wafer with the highest yield from the plurality of combinations of die placement and one or more locations on the wafer.

16. A method of adjusting a die placement of dice to be formed on a wafer, the method comprising:
a) obtaining a die placement of dice to be formed on the wafer;
b) obtaining one or more locations on the wafer contacted by one or more processing structures or a substance emitted by one or more processing structures; and
c) adjusting the die placement based on the obtained one or more locations on the wafer, wherein the adjusted die placement produces a higher yield of dice formed on the wafer than the die placement obtained in step a).

17. The method of claim 16, wherein step c) of claim 16 comprises:
generating a plurality of die placements having different arrangements of dice;
determining a yield associated with each of the plurality of die placements; and
selecting a die placement with the highest yield from the plurality of die placements.

18. The method of claim 16, further comprising:
d) adjusting the one or more locations on the wafer based on the die placement, wherein the die placement and the one or more locations on the wafer are adjusted together.

19. The method of claim 18, wherein step c) of claim 16 and step d) of claim 18 comprise:
generating a plurality of combinations of die placement and one or more locations on the wafer;
determining a yield associated with each of the plurality of combinations of die placement and one or more locations on the wafer; and
selecting a combination of die placement and one or more locations on the wafer with the highest yield from the plurality of combinations of die placement and one or more locations on the wafer.

20. The method of claim 16, wherein the dice are formed on a first surface on the wafer, and wherein the one or more locations are on the first surface of the wafer or on a second surface on the wafer opposite the first surface.

21. A computer-readable medium having computer-executable instructions to adjust a die placement of dice to be formed on a wafer, comprising instructions for:
a) obtaining a die placement of dice to be formed on the wafer;
b) obtaining one or more locations on the wafer contacted by one or more processing structures or a substance emitted by one or more processing structures; and
c) adjusting the die placement based on the obtained one or more locations on the wafer, wherein the adjusted die placement produces a higher yield of dice formed on the wafer than the die placement obtained in step a).

22. The computer-readable medium of claim 21, wherein c) of claim 21, comprises instructions for:
generating a plurality of die placements having different arrangements of dice;
determining a yield associated with each of the plurality of die placements; and
selecting a die placement with the highest yield from the plurality of die placements.

* * * * *